United States Patent
Hisano et al.

(10) Patent No.: US 6,376,905 B2
(45) Date of Patent: Apr. 23, 2002

(54) SEMICONDUCTOR PACKAGE

(75) Inventors: Nae Hisano, Kashiwa; Hideo Miura, Koshigaya, both of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/767,720

(22) Filed: Jan. 24, 2001

(30) Foreign Application Priority Data

Jan. 28, 2000 (JP) ........................................ 2000-024693

(51) Int. Cl.[7] .................... H01L 23/495; H01L 23/48
(52) U.S. Cl. .................... 257/690; 257/787; 257/666; 257/793
(58) Field of Search .................... 257/787, 666, 257/690, 793, 775, 677; 438/112, 124, 127, 123, 126

(56) References Cited

U.S. PATENT DOCUMENTS 5,023,698 A * 6/1991 Kobayashi et al. ......... 257/666

FOREIGN PATENT DOCUMENTS

| JP | 5-67713 | * | 3/1993 | ................ 257/666 |
| JP | 9-148509 | * | 6/1997 | ................ 257/666 |
| JP | 9-199655 | * | 7/1997 | ................ 257/666 |

OTHER PUBLICATIONS

Tanaka et al., "Thermal Analysis of Plastic QFP with High Thermal Dissipation", 1992, IEEE, pp. 332–339.

* cited by examiner

Primary Examiner—Jhihan B Clark
(74) Attorney, Agent, or Firm—Antonelli, Terry, Stout & Kraus, LLP

(57) ABSTRACT

A resin encapsulated semiconductor package, which uses leads (lead frame), and enhances heat conducting properties and prevents breaking of lengths of bonding wire, reduction in service life of solder joints and crack of a resin while ensuring reliability on strength. A lead material uses a material containing as a main constituent material a composite alloy of $Cu_2O$ and $Cu$, which has a thermal conductivity as high as that of copper alloys having been conventionally used, and which is sintered to have a small linear expansion coefficient as compared with such copper alloys.

4 Claims, 5 Drawing Sheets

SEMICONDUCTOR PACKAGE

BACKGROUND OF THE INVENTION i) Field of the Invention

The present invention relates to a resin encapsulated semiconductor package using a lead frame.

ii) Description of Related Art

Conventionally, a lead frame of a resin encapsulated semiconductor package uses a 42 Ni-Fe alloy or a copper alloy.

For example, quad flat packages (QFP) such as application specific integrated circuits (ASIC) and microcomputers entail large power dissipation and so use a lead frame of a copper alloy. Thin small outline packages (TSOP) mounting thereon memory devices such as a dynamic random access memory (DRAM), a static random access memory (SRAM) or the like, which are large in generation of heat and size are mounted, use a 42 Ni-Fe alloy. Also, a quad flat nonleaded package (QFN), a SOP and a QFP, which mount thereon an IC for electric power, generally uses a lead frame formed of a copper alloy.

Linear expansion coefficients of parts constituting a resin encapsulated semiconductor package are significantly different from one another such that a copper alloy used as a frame material has a linear expansion coefficient of $17 \times 10^{-6}/°$ C., a 42 Ni-Fe alloy has a linear expansion coefficient of $4 \times 10^{-6}$ to $5 \times 10^{-6}/°$ C., silicon as a semiconductor device has a linear expansion coefficient of $3 \times 10^{-6}/°$ C., and a molding or encapsulating resin has a linear expansion coefficient of 12 to $25 \times 10^{-6}/°$ C. Thus thermal stresses generate inside the semiconductor package in a cooling process after a resin molding or encapsulating process, in a temperature cycle test for testing reliability. In the temperature cycle test, such thermal stresses apply repeatedly to thereby cause fatigue crack in a resin from an end of a die pad or a lead frame, or a bonding wire is sometimes disconnected due to fatigue. Also, the temperature cycle test after packaging of a substrate or repetition of ON/OFF in electronic equipments may cause fatigue failure in solder joints of leads due to differences in linear expansion coefficient between the semiconductor package and the packaged substrate.

Differences in linear expansion coefficient between a frame material and a semiconductor device are such that a 42 Ni-Fe alloy has a smaller difference and a smaller thermal stress generated than a copper alloy does. Therefore, only replacement into a copper alloy as a lead frame material with a view to enhancement in heat conduction from a semiconductor package will lead to increased thermal stresses and an increased possibility of generation of the above-mentioned fatigue failure, and so making the sacrifice of heat conduction in some measure a conventional 42 Ni-Fe alloy has been recently used in memory TSOPs having an increased heat dissipation and a large chip size. Also, in microcomputers having a relatively large chip size and a high power dissipation and high pin counts QFPs mounting thereon ASICs, a copper alloy based lead frame has been used which is small in self inductance to be suited to the high frequency operation, and high in heat conducting properties. However, when a solder used in small chips and having a large thermal conductivity is used to bond a device to a lead frame, solder fatigue occurs to deteriorate bonding, so that only an epoxy based bonding material (silver paste or the like) having a low Young's modulus has been used.

In recent small-sized portable electronic equipments, small-sized semiconductor devices have multiplied which are of a structure called a chip scale package (CSP) and adopt electric connection with solder bumps arranged in a matrix configuration. CSPs have a large volume ratio of a device in a semiconductor package, and an apparent linear expansion coefficient close to that of the device. Therefore, with packaged substrates of small-sized portable equipments with a large number of CSPs mounted thereon, it has become general to use a low thermal expansion substrate, in which a conventional linear expansion coefficient of 15 to $16 \times 10^{-6}/°$ C. is reduced to about half, that is, $8 \times 10^{-6}/°$ C. However, with resin encapsulated semiconductor devices for mixed loading on a low expansion substrate and making use of a conventional lead frame using a copper alloy, there is a fear of reduction in life of solder joints and generation of resin crack because of an increased difference in linear expansion coefficient between the devices and the substrate.

SUMMARY OF THE INVENTION

An object of the present invention is to solve at least one of the aforementioned problems, and to provide a resin encapsulated semiconductor package, which ensures reliability on strength and has high heat conducting properties.

The object of the present invention is attained, for example, by constituting a resin encapsulated semiconductor package in the following manner. That is to say, used as a material for a lead frame is a material composed mainly of a composite alloy of $Cu_2O$ and Cu (having largest contents among materials constituting leads), which is sintered to have a thermal conductivity comparable to that of a copper alloy conventionally used and a smaller linear expansion coefficient than that of the copper alloy. A range where physical properties of the $Cu/Cu_2O$ composite alloy are examined is 20 to 80 vol. % in terms of a compounding ratio of $Cu_2O$, and involves 280 to 41 W/(mK) of thermal conductivity and 13.8 to $5.5 \times 10^{-6}/°$ C. of linear expansion coefficient. For example, in the case where there is a need of a thermal conductivity of 150 W/(mK) or more comparable to that of a copper alloy used in semiconductor devices with a view to high heat conduction, the compounding ratio of $Cu_2O$ suffices to be set to 20 to 46%. In this case, the linear expansion coefficient of the $Cu/Cu_2O$ composite alloy amounts to about 13.8 to $10.5 \times 10^{-6}/°$ C., and approximates to $3 \times 10^{-6}/°$ C. of linear expansion coefficient of a chip as compared with $17 \times 10^{-6}/°$ C. of linear expansion coefficient of a copper alloy. However, in the case where there is a need of a linear expansion coefficient of 4 to $5 \times 10^{-6}/°$ C. comparable to that of 42 alloy for the sake of stress relaxation, making a compounding ratio of $Cu_2O$ in the $Cu/Cu_2O$ composite alloy 80% results in $5.5 \times 10^{-6}/°$ C. of linear expansion coefficient, and 41 W/(mK) of thermal conductivity. Such value is 2.7 times 15 W/(mK) of thermal conductivity of a 42 alloy. In this manner, it suffices to freely adjust the compounding ratio in accordance with an object.

DETAILED DESCRIPTION OF THE PREFERRED EMBODIMENTS

Figure 1:
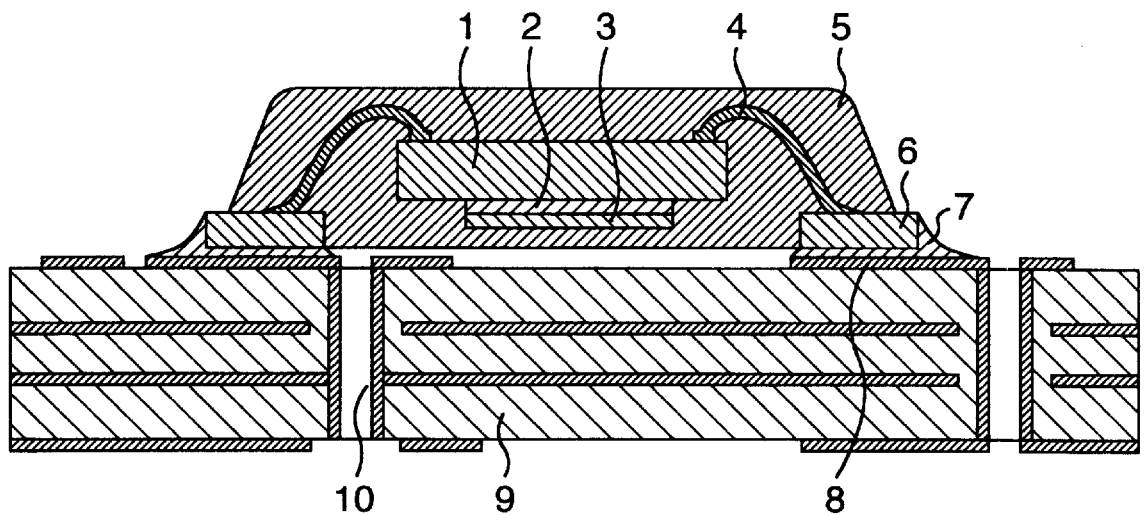
FIG. 1 is a cross sectional view showing a semiconductor package according to a first embodiment of the present invention, in which a QFN using a $Cu/Cu_2O$ composite alloy for a lead frame is mounted on a substrate by soldering.
Figure 9:
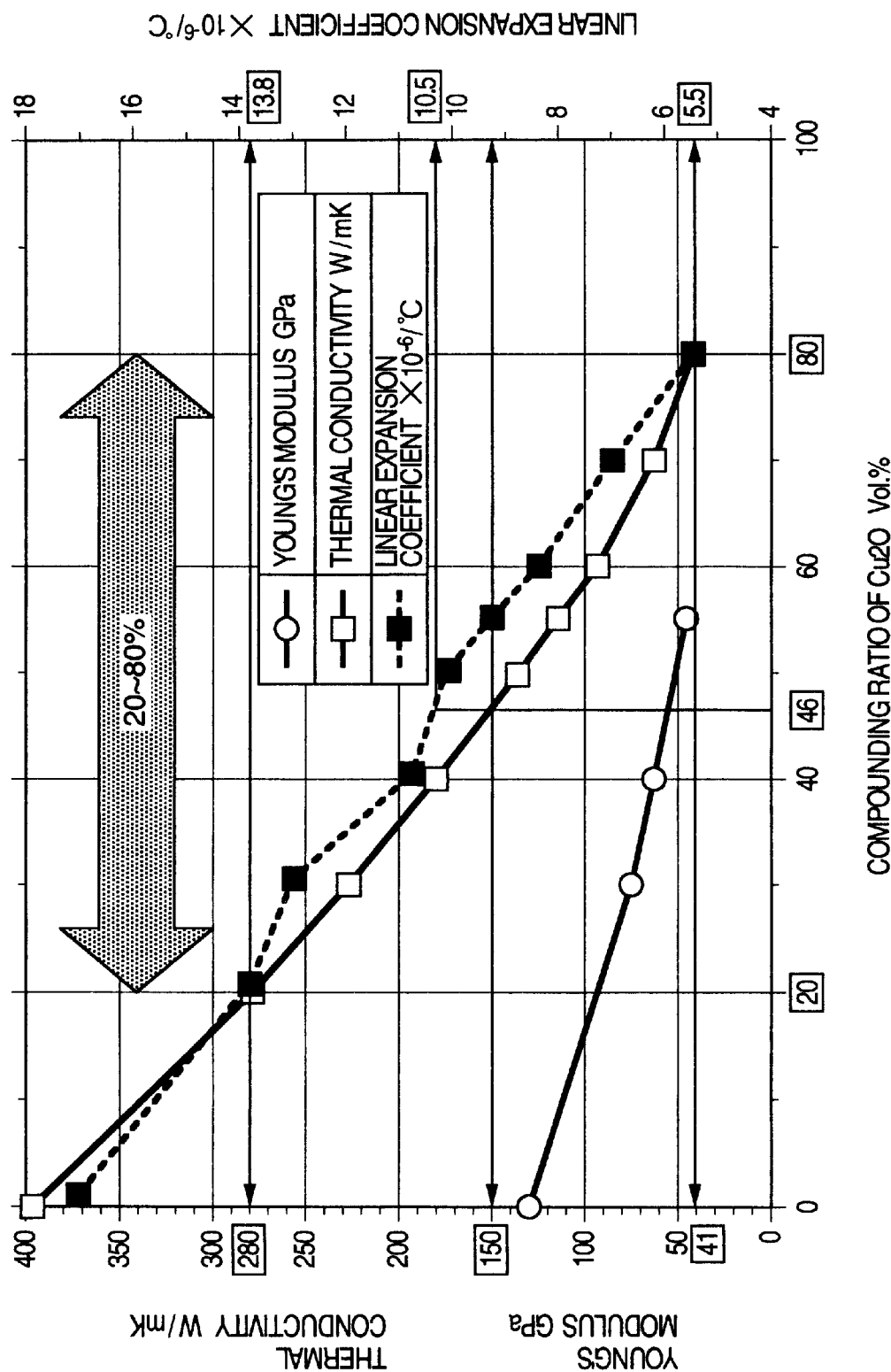
FIG. 9 is a graph showing changes in Young's modulus, thermal conductivity, and linear expansion coefficient for a compounding ratio of Cu$_2$O in a Cu/Cu$_2$O composite alloy in the present invention.

A cross sectional view of a semiconductor package according to a first embodiment of the present invention is shown in FIG. 1. A semiconductor device 1 is bonded to a tab 3 of a lead frame formed of a Cu/Cu$_2$O composite alloy by an attachment material 2, and electrically connected to leads 6 of the lead frame of the Cu/Cu$_2$O composite alloy by lengths of bonding wire 4. The semiconductor device 1 and electric connections are encapsulated by a resin 5. The leads 6 are exposed to a lower surface of the molding or encapsulating resin, and such exposed portions are electrically connected to foot prints 8 of a substrate 9 by solders 7. The tab 3 and leads 6 are portions of the uniformly thick lead frame of the Cu/Cu$_2$O composite alloy, but the tab 3 is processed by etching a tab back surface to be made thinner than the leads 6. The substrate is provided with multi-layers of trace, and a surface trace is electrically connected to inner layers or a back surface trace by through holes 10. When the package is mounted on a substrate of low thermal expansion, the present structure is effective in preventing resin crack on the tab back surface. Physical property values for compounding ratios of Cu$_2$O in Cu/Cu$_2$O composite alloy are shown in FIG. 9. When making much account of heat conducting properties, a lead frame material desirably has a compounding ratio of the Cu/Cu$_2$O composite alloy in the range of 20 to 46 vol. % in terms of Cu$_2$O compounding ratio, in which thermal conductivity is obtained to be equal to or more than 150 W/(mK) of a conventional copper alloy lead frame. In FIG. 1, the semiconductor device 1 is larger than the tab 3, but may be smaller than the tab 3.

Figure 2:
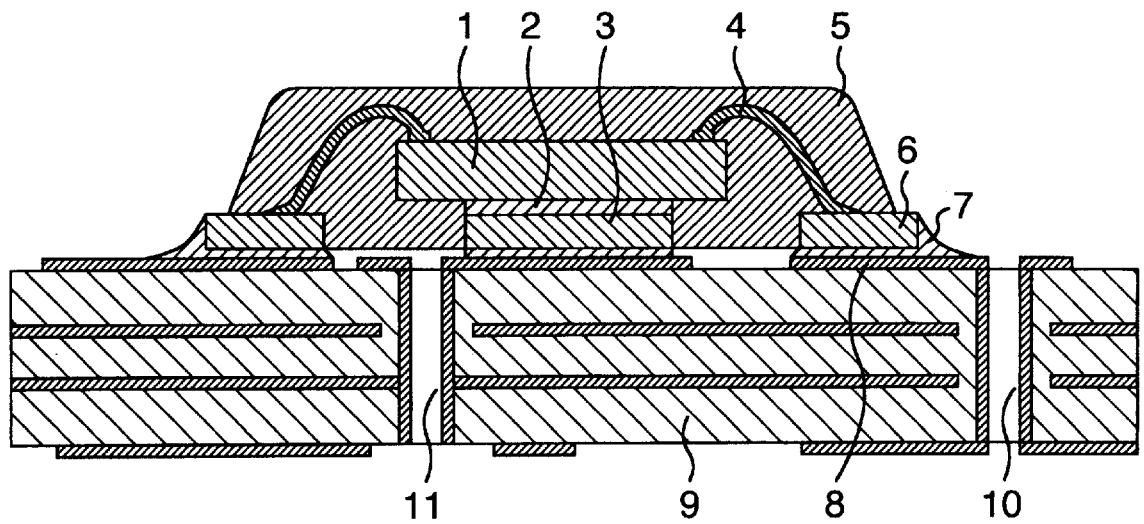
FIG. 2 is a cross sectional view showing a semiconductor package according to a second embodiment of the present invention, in which a back surface of a tab of a QFN using a $Cu/Cu_2O$ composite alloy for a lead frame is exposed, and the QFN is mounted on a substrate by soldering.

A cross sectional view of a semiconductor package according to a second embodiment is shown in FIG. 2. The semiconductor device 1 is bonded to the tab 3 of the lead frame formed of the Cu/Cu$_2$O composite alloy by means of the attachment material 2, and electrically connected to leads 6 of the lead frame of the Cu/Cu$_2$O composite alloy by lengths of bonding wire 4. The semiconductor device 1 and electric connections are encapsulated by the resin 5. The leads 6 are electrically connected to foot prints 8 of a substrate 9 by solders 7. The tab 3 and leads 6 constitute one lead frame of the Cu/Cu$_2$O composite alloy having a uniform thickness, and a back surface of the tab 3 is exposed to an underside of the molding or encapsulating resin in the same manner as the leads 6. Heat conduction can be enhanced by soldering such back surface of the tab to the substrate 9. A trace, to which the back surface of the tab is soldered, is provided with a thermal via 11, which promotes heat conduction of inner layers to surface-shaped trace. In the case where the semiconductor device is firmly fixed to the substrate as shown in FIG. 2, it is difficult to cause deformation of the leads to accommodate thermal stresses generated by temperature cycle. Therefore, in the same manner as the first embodiment, particularly when a substrate of low thermal expansion is used, the use of the Cu/Cu$_2$O composite alloy in the lead frame of the present structure is effective in reduction of stresses.

Figure 3:
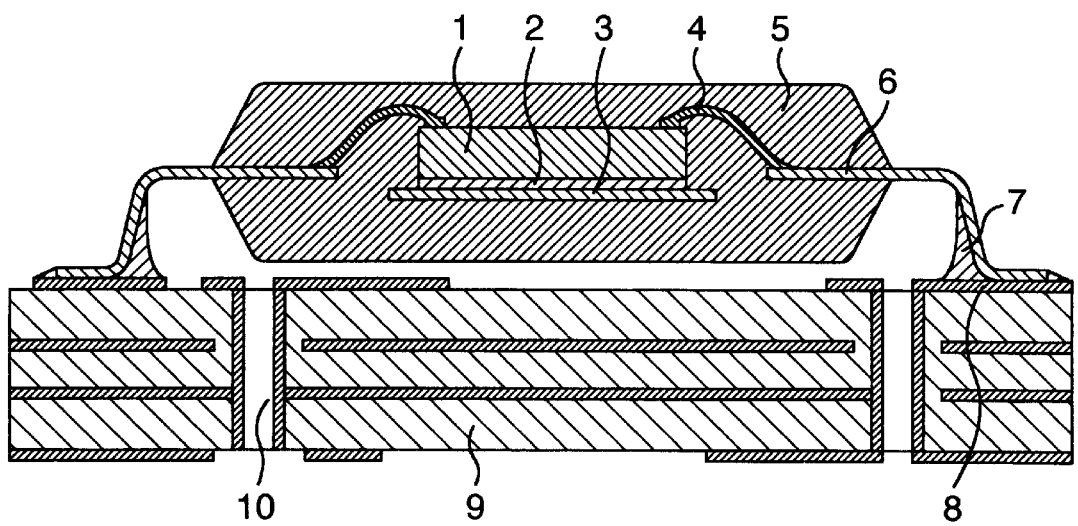
FIG. 3 is a cross sectional view showing a semiconductor package according to a third embodiment of the present invention, in which a QFP or a SOP using a Cu/Cu$_2$O composite alloy for a lead frame mounted on a substrate by soldering.

A cross sectional view of a semiconductor package according to a third embodiment is shown in FIG. 3. The semiconductor device 1 is bonded to the tab 3 of the lead frame formed of the Cu/Cu$_2$O composite alloy by means of the attachment material 2, and electrically connected to leads 6 of the lead frame of the Cu/Cu$_2$O composite alloy by lengths of bonding wire 4. The semiconductor device 1 and electric connections are encapsulated by the resin 5. The leads 6 are drawn outside of the resin from the side of the semiconductor device, and external leads are electrically connected to foot prints 8 of the substrate 9 by solders 7. Conventional examples of the semiconductor device according to the third embodiment include a quad flat package (QFP) and a small outline package (SOP), in which a copper alloy is used for a lead frame. ASICs, microcomputerds, or the like, which are relatively large in device area, are mounted on a large-sized QFP having an external shape of 28 mm square. In this case, a solder of large rigidity cannot be used for the attachment material 2, and so a soft epoxy based silver paste is used therefor making the sacrifice of heat conducting properties. However, the use of a lead frame material of the Cu/Cu$_2$O composite alloy according to the present invention makes attachment by a solder of good thermal conductivity possible, and further enhanced heat conduction of the semiconductor package is enabled.

Figure 4:
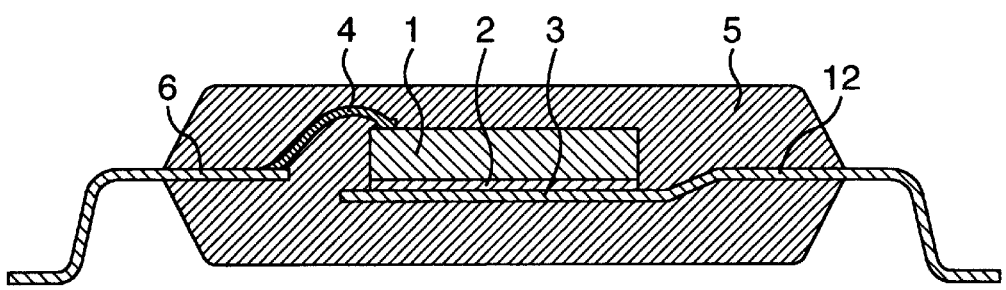
FIG. 4 is a cross sectional view showing a semiconductor package according to a fourth embodiment of the present invention, in which a HQFP or a HSOP includes a lead frame having fused leads using a Cu/Cu$_2$O composite alloy.

A cross sectional view of a semiconductor package according to a fourth embodiment is shown in FIG. 4. The semiconductor device 1 is bonded to the tab 3 of the lead frame formed of the Cu/Cu$_2$O composite alloy by means of the attachment material 2, and electrically connected to leads 6 of the lead frame of the Cu/Cu$_2$O composite alloy by lengths of bonding wire 4. The semiconductor device 1 and electric connections are encapsulated by the resin 5. The leads 6 for receiving/transmitting electric signals are electrically insulated from the tab 3, but the fused leads 12 contiguous to the tab 3 are provided as shown in FIG. 4. Unlike ASICs, microcomputers and so on, ICs for electric power do not need a large number of signal pins, and so make much use of QFPs with a heatsink (HQFP) or SOPs with the heatsink (HSOP), which are formed by providing fused leads 12 on QFPs and SOPs. Heat conduction can be further enhanced by soldering the fused leads 12 to the substrate. The fused leads 12 have the same width as that of signal leads in some cases, but is formed wide having priority to heat conduction in other cases. In the latter case, the fused leads are firmly soldered to the substrate, so that it is difficult for the fused leads to accommodate thermal deformation, which can lead to breakage of a solder joint. However, the breakage of the solder joint portion can be prevented by using the Cu/Cu$_2$O composite alloy for the lead frame of the present structure.

Figure 5:
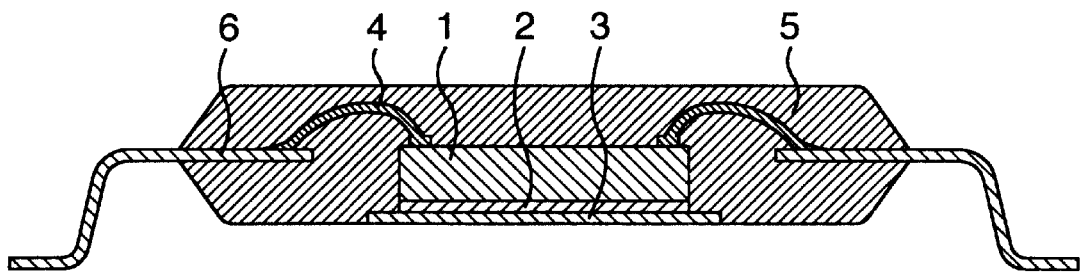
FIG. 5 is a cross sectional view showing a semiconductor package according to a fifth embodiment of the present invention, in which a HQFP or a HSOP uses a Cu/Cu$_2$O composite alloy for a lead frame and a back surface of a tab is exposed.

A cross sectional view of a semiconductor package according to a fifth embodiment is shown in FIG. 5. The semiconductor device 1 is bonded to the tab 3 formed of the Cu/Cu$_2$O composite alloy by means of the attachment material 2, and electrically connected to leads 6 formed of the Cu/Cu$_2$O composite alloy by lengths of bonding wire 4. The semiconductor device 1 and electric connections are encapsulated by the resin 5. The tab 3 and leads 6 constitute one lead frame of the Cu/Cu$_2$O composite alloy having a uniform thickness, and a back surface of the tab 3 is exposed to an underside of the molding or encapsulating resin. The present arrangement has the same effect as described in the second embodiment.

Figure 6:
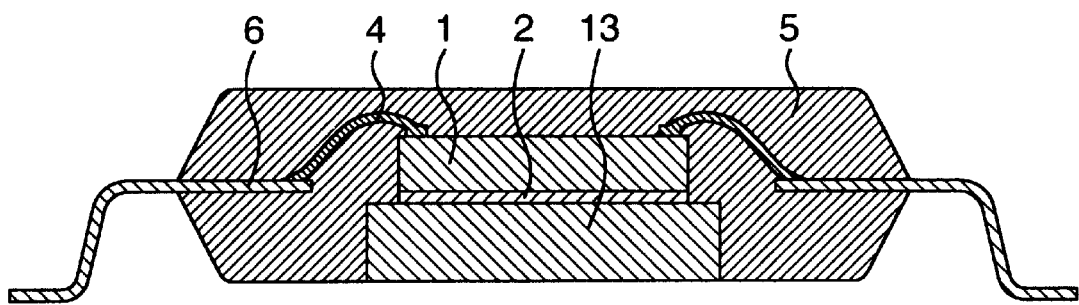
FIG. 6 is a cross sectional view showing a semiconductor package according to a sixth embodiment of the present invention, in which a HQFP or a HSOP uses a Cu/Cu$_2$O composite alloy for a lead frame, which has two or more different thicknesses, and a back surface of a tab is exposed.

A cross sectional view of a semiconductor package according to a sixth embodiment is shown in FIG. 6. The semiconductor device 1 is bonded to the tabs 3 of the lead frame formed of the Cu/Cu$_2$O composite alloy by means of the attachment material 2, and electrically connected to leads 6 of the lead frame of the Cu/Cu$_2$O composite alloy by lengths of bonding wire 4. The semiconductor device 1 and electric connections are encapsulated by the resin 5. The tab 13 and leads 6 constitute parts of a single sheet of profile lead frame formed of the Cu/Cu$_2$O composite alloy and having at least two different kinds of thicknesses, the tab 13 is formed to be thicker than the leads 6, and the back surface of the tab is exposed to an underside of the molding or encapsulating resin. Enhanced heat conduction can be achieved by soldering the back surface of the tab to the substrate. The present arrangement has the same effect as described in the second embodiment.

Figure 7:
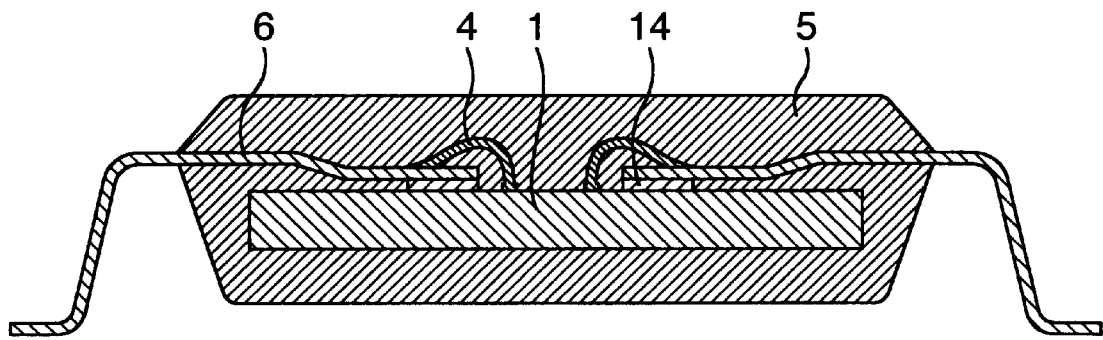
FIG. 7 is a cross sectional view showing a semiconductor package according to a seventh embodiment of the present invention, in which a TSOP of LOC structure uses a Cu/Cu$_2$O composite alloy for a lead frame.

A cross sectional view of a semiconductor package according to a seventh embodiment is shown in FIG. 7. The leads 6 of the lead frame formed of the Cu/Cu$_2$O composite alloy are bonded to a circuit forming surface of the semiconductor device 1 with an insulating film 14 therebetween, and the leads 6 are electrically connected to the semiconductor device 1 by lengths of bonding wire 4. The semiconductor device 1 and electric connections are encapsulated by the resin 5. The leads 6 are drawn outside of the resin from the side of the semiconductor device. The semiconductor package according to the seventh embodiment is a lead on chip (LOC) structure frequently used in memory devices, and is capable of mounting thereon a large device having an outer shape close to that of the resin. There is a tendency to an increase in power dissipation of memory devices, and so the use of a copper alloy in place of a 42 Ni-Fe alloy conventionally used as a lead frame material has been investigated. However, there is a fear that such use may lead to an increase in thermal stress, reduction in life of solder joints with the substrate and breakage of bonding wire. Provided that the compounding ratio Of CU$_2$O is made 80 vol. %, enhanced heat conduction can be achieved without being prejudicial to low stresses equivalent to those in the 42 Ni-Fe alloy. Provided that the compounding ratio of CU$_2$O is in a range of 20 to 50 vol. %, enhanced heat conduction becomes possible in excess of that obtained with a copper alloy, which is ordinarily used as a lead frame material.

Figure 8:
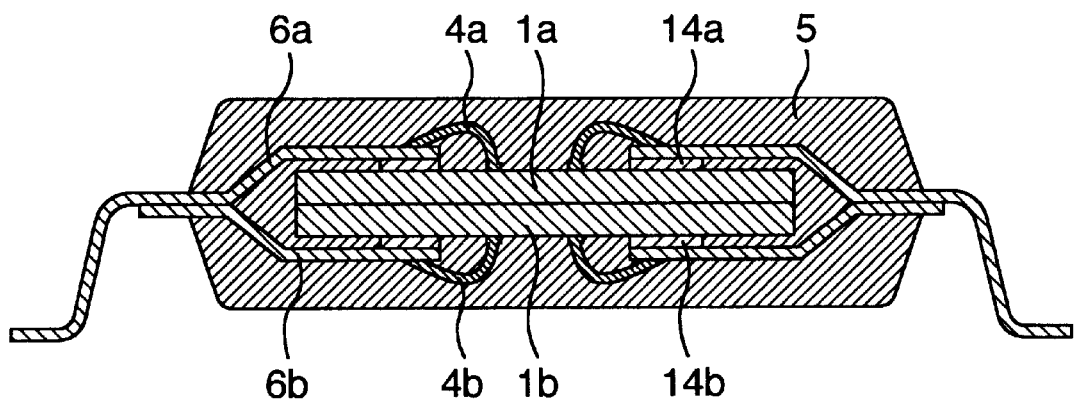
FIG. 8 is a cross sectional view showing a semiconductor package according to an eighth embodiment of the present invention, in which two semiconductor devices are mounted in a TSOP of LOC structure using a Cu/Cu$_2$O composite alloy for a lead frame.

A cross sectional view of a semiconductor package according to an eighth embodiment is shown in FIG. 8. Leads 6a of a lead frame formed of the Cu/Cu$_2$O composite alloy are bonded to a circuit forming surface of a semiconductor device 1a with an insulating film 14a therebetween, and the leads 6a are electrically connected to the semiconductor device 1 by lengths of bonding wire 4a. A semiconductor device 1b, leads 6b and lengths of bonding wire 4b, which are constituted in the same manner as that of the above arrangement, is disposed back to back relative to the device 1a, and these two semiconductor devices and electric connections are encapsulated by the resin 5. The leads 6b are connected to the leads 6a, and electrical connection with the substrate is made by the leads 6a, which are extended and drawn outside of the resin from the semiconductor package. The semiconductor package of the present constitution is applied in the case where memory devices are mounted in high density. The present constitution has the same effect as described in the seventh embodiment.

According to the present invention, there can be provided a resin encapsulated semiconductor package, in which reliability on strength is ensured and heat conducting properties are high as well.

What is claimed is:

1. A semiconductor package comprising:

a semiconductor device;

leads electrically connected to said semiconductor device through lengths of bonding wire, and composed mainly of a Cu/Cu$_2$O composite alloy; and a resin provided in an area of said semiconductor device for connection to said lengths of bonding wire, on said lengths of bonding wire, and an area of said leads for connection to said lengths of bonding wire.

2. A semiconductor package comprising:

a semiconductor device;

leads electrically connected to said semiconductor device through lengths of bonding wire, and composed mainly of a Cu/Cu$_2$O composite alloy;

a tab composed mainly of said Cu/Cu$_2$O composite alloy for supporting a surface of said semiconductor device opposite to a surface thereof, to which said lengths of bonding wire are connected; and a resin provided in an area of said semiconductor device for connection to said lengths of bonding wire, on said lengths of bonding wire, and an area of said leads for connection to said lengths of bonding wire.

3. The semiconductor package according to claim 1 or 2, wherein said Cu/Cu$_2$O composite alloy has 20 to 80 vol. % of Cu$_2$O content.

4. A semiconductor package comprising:

a silicon chip;

leads electrically connected to said silicon chip through lengths of bonding wire;

a tab for supporting a surface of said semiconductor device opposite to a surface thereof, to which said lengths of bonding wire are connected; and a resin provided in an area of said semiconductor device for connection to said lengths of bonding wire, on said lengths of bonding wire, and an area of said leads for connection to said lengths of bonding wire, and wherein a material mainly composing of said leads and said tab has the thermal conductivity of 280 to 41 W/(mK), and the linear expansion coefficient of 13.8 to $5.5 \times 10^{-6}/°$ C.

* * * * *